United States Patent [19]

Wong et al.

[11] Patent Number: 4,929,185

[45] Date of Patent: May 29, 1990

[54] PRINTED CIRCUIT BOARD ASSEMBLY

[75] Inventors: Daniel T. Wong, West Columbia; Floyd G. Speraw, Lexington, both of S.C.

[73] Assignee: NRC Corporation, Dayton, Ohio

[21] Appl. No.: 331,915

[22] Filed: Apr. 3, 1989

[51] Int. Cl.[4] .............................................. H01R 9/09
[52] U.S. Cl. ........................................ 439/74; 439/75; 439/97; 439/782; 361/420
[58] Field of Search ................. 439/74, 75, 95, 97, 439/781, 782, 813; 361/417, 419, 429

[56] References Cited

U.S. PATENT DOCUMENTS

| 3,459,998 | 8/1969 | Focarile | 317/100 |
|---|---|---|---|
| 3,475,657 | 10/1969 | Knowles | 339/17 |
| 3,533,023 | 10/1970 | Friend et al. | 333/84 |
| 3,596,138 | 7/1971 | Lehrfeld | 317/101 |
| 3,836,704 | 9/1974 | Coules | 361/420 |
| 4,100,368 | 7/1978 | Thomsen | 361/420 |
| 4,130,328 | 12/1978 | Wessel | 439/75 |
| 4,309,856 | 1/1982 | Varnau et al. | 439/74 |
| 4,390,222 | 6/1983 | Carter | 339/45 M |
| 4,401,351 | 8/1983 | Record | 339/17 LM |
| 4,416,496 | 11/1983 | Brefka | 339/17 C |
| 4,470,100 | 9/1984 | Rebaudo et al. | 339/17 F |
| 4,506,439 | 3/1985 | Roake | 361/395 |
| 4,514,784 | 4/1985 | Williams et al. | 439/74 |
| 4,558,914 | 12/1985 | Prager et al. | 339/75 R |
| 4,627,677 | 12/1986 | Ono et al. | 439/75 |
| 4,636,018 | 1/1987 | Stillie | 439/66 |
| 4,638,405 | 1/1987 | Smith | 339/75 M |
| 4,790,762 | 12/1988 | Harms, deceased et al. | 439/59 |
| 4,871,316 | 10/1989 | Herrell et al. | 439/74 |

FOREIGN PATENT DOCUMENTS 507604  6/1939  United Kingdom ................ 361/419

Primary Examiner—P. Austin Bradley
Attorney, Agent, or Firm—Wilbert Hawk, Jr.; Stephen F. Jewett; James M. Stover

[57] ABSTRACT

The subject invention is a device for joining and separating first and second printed circuit boards connectable by a socket on one of the boards and a plurality of pins projecting from the other of the boards. The device comprises a screw held captive to the first board but rotatable therein, and a spacer fastened to the second board and having a threaded hole for receiving the screw. The pins are inserted into and withdrawn from the socket by the engagement and disengagement, respectively, of the threaded hole by the screw.

23 Claims, 3 Drawing Sheets

PRINTED CIRCUIT BOARD ASSEMBLY

The present invention relates to a printed circuit board assembly and, more particularly, to a device for joining and separating two circuit boards connected by a relatively large number of pins.

BACKGROUND OF THE INVENTION

The ever increasing density of logic and other electronic components used in computer systems has resulted in the development of sub-modules which are basically intermediate size planar printed circuit boards to which smaller components are connected. The components are typically connected to the sub-module by pins and are interconnected by conductors within the sub-module.

Each sub-module is connected to a still larger printed circuit board in a face to face relationship. Connections between the sub-module and printed circuit board are provided by a plurality of pins projecting normally from the board or sub-module and a socket on the other, the pins being inserted into the socket. Frequently, the pins are arranged to form discrete connectors. Due to the many logic components which may be connected to a sub-module, a relatively large number of connecting pins for each sub-module connector are required. For example, sub-modules with sockets for receiving over three hundred pins per connector may be required for some applications.

A particular problem which high pin count connectors creates is that a relatively large force is needed to separate two boards. If a single pin requires a six to eight ounce extraction force, three hundred pins requires a one hundred to one hundred fifty pound extraction force. Application of such a force can damage one or both boards and/or bend pins so that reinsertion is difficult, if not impossible.

Although joining such boards is not as problematic as separating them, care must be exercised during the assembly process. Excessive force applied at the incorrect point or angle can result in damage.

OBJECTS OF THE INVENTION

It is therefore an object of the present invention to provide a new and improved device for joining and separating printed circuit boards.

It is another object of the present invention to provide a device for joining and separating circuit boards without damaging the boards or bending the connecting pins.

It is yet another object of the present invention to provide a device for joining and separating, with a relatively small applied force, two circuit boards connected by a relatively high number of pins.

It is a further object of the present invention to provide a circuit board joining and separation device which is reliable, accessible and easy to operate.

It is yet a further object of the present invention to provide a new and improved printed circuit board assembly.

SUMMARY OF THE INVENTION

The present invention is a device for joining and separating first and second printed circuit boards connectable by a socket on one of the boards and a plurality of pins projecting from the other of the boards. The device comprises a screw held captive to the first board but rotatable therein, and a spacer fastened to the second board and having a threaded hole for receiving the screw. The pins are inserted into and withdrawn from the socket by the engagement and disengagement, respectively, of the threaded hole by the screw.

DESCRIPTION OF A PREFERRED EMBODIMENT

Figure 1:
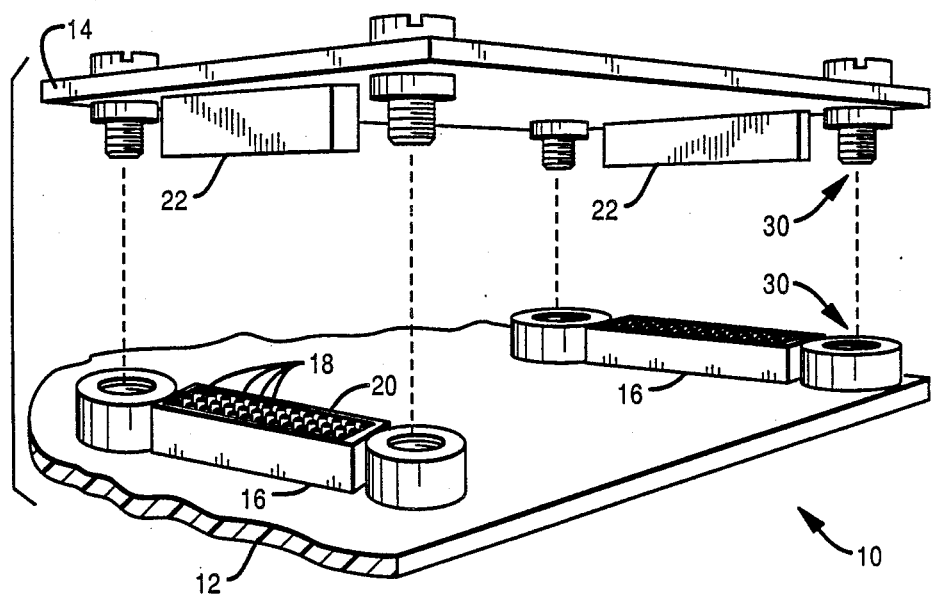
FIG. 1 shows an exploded view of a printed circuit board assembly according to one form of the invention.

FIG. 1 is an exploded view of a printed circuit board assembly 10 according to one form of the present invention. Assembly 10 comprises a main printed circuit board 12 and a sub-module or secondary board 14. Main board 12 includes connectors 16 attached thereto. Each connector 16 includes a plurality of connector pins 18 and a shroud 20 which surrounds pins 18. Shroud 20 is optional and in one embodiment of the present invention may be eliminated. Connector pins 18 project or extend away from main board 12 and are generally normal thereto. Secondary board 14 includes sockets 22, each socket 22 having a plurality of holes (not shown) for receiving the pins of a connector 16. Although pins 18 are shown and described as extending from main board 12, the invention applies equally to pins 18 extending from secondary board 14 with a mating socket connected to main board 12. In a preferred embodiment, both pins 18 and socket 22 are generally normal to their respective boards, and, when assembled, secondary board 14 is generally parallel to main printed circuit board 12.

Figure 2:
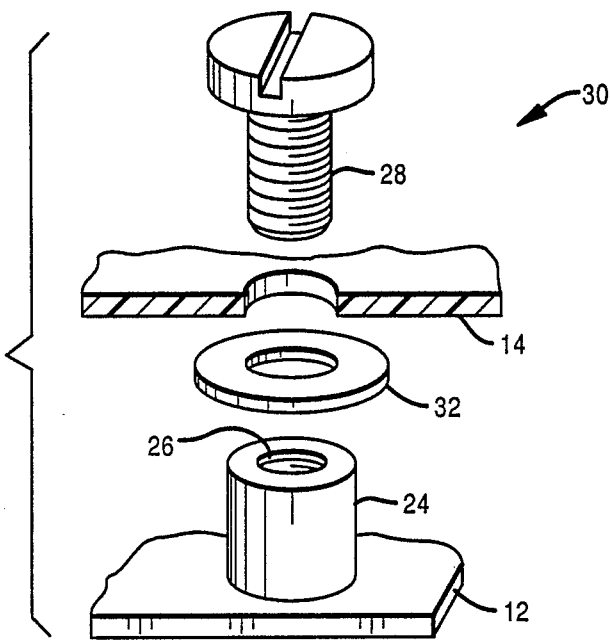
FIG. 2 shows an exploded view of the device for joining and separating the boards shown in FIG. 1.

The printed circuit board assembly 10 also includes devices 30 for joining and separating circuit boards 12 and 14. FIG. 2 shows an exploded view of a device 30 according to one form of the present invention. Device 30 includes a plurality of spacers 24 fastened to main board 12. In a preferred embodiment spacer 24 is fastened to board 12 by inserting one end of spacer 24 through a hole in board 12 and swaging that end to the underside of board 12. Spacer 24 has a threaded hole 26 for receiving a screw 28. Screw 28 extends through secondary board 14 and engages threaded hole 26, as will be more fully discussed hereafter. Device 30 also includes a flexible washer 32 for holding screw 28 captive to secondary board 14. Washer 32 is pressed onto screw 28 to prevent screw 28 from becoming separated from board 14, but washer 32 does not interfere with the rotation of screw 28. Restated, washer 32 prevents longitudinal movement of screw 28 relative to secondary board 14. In addition, washer 32 permits, and generally does not inhibit, the rotation of screw 28 relative to board 14. In a preferred embodiment, washer 32 is nylon.

Boards 12 and 14 are connected by pins 18 and sockets 22. The purpose of device 30 is to insert and withdraw pins 18 into and from socket 22 by the engagement and disengagement, respectively, of threaded hole 26 by screw 28. As screw 28 engages threaded hole 26, the portion of board 14 proximate screw 28 is drawn towards main board 12. In this manner, as each of the screws 28 is tightened, the boards 12 and 14 are drawn together. As the boards approach each other, pins 18 are inserted into mating holes in sockets 22. As each screw 28 is disengaged from its respective threaded hole 26 by loosening or backing out, pins 18 are slowly and evenly withdrawn from their respective mating holes in sockets 22.

Figure 3:
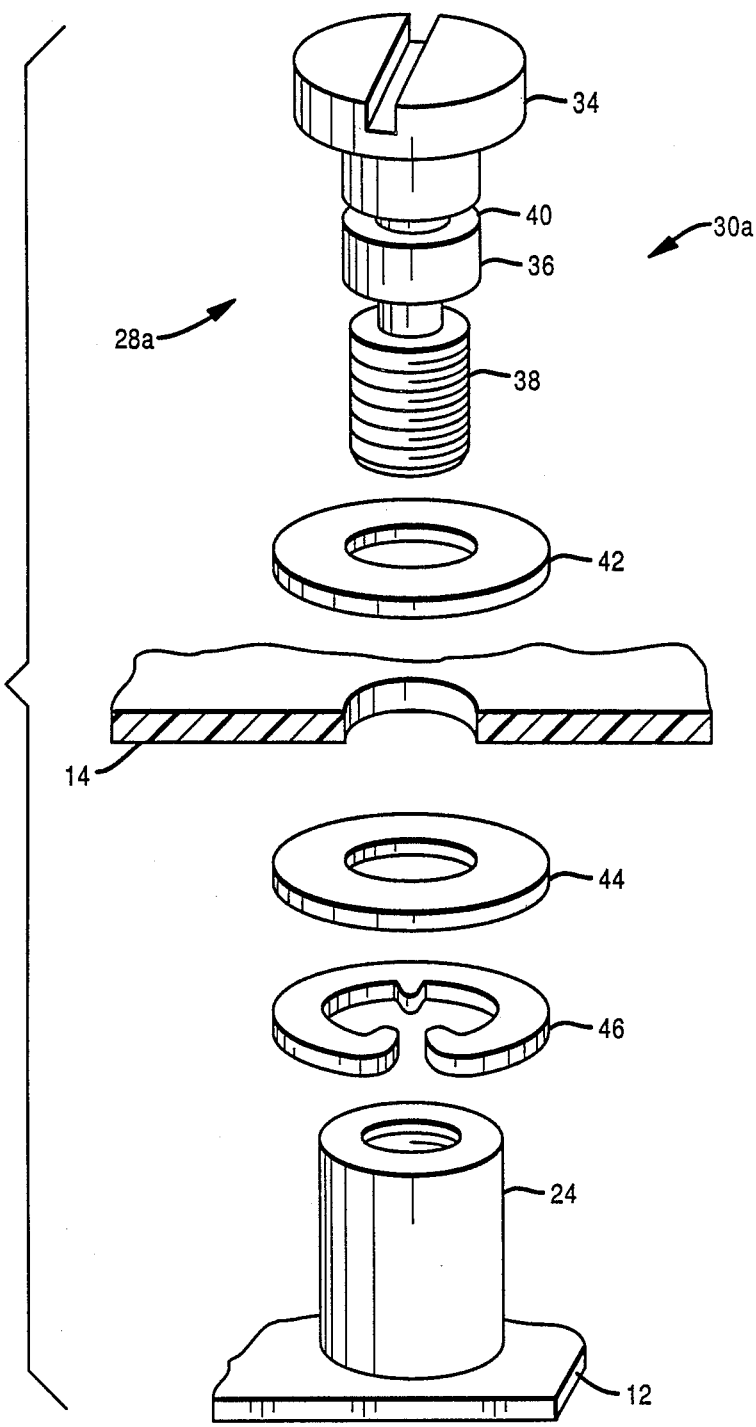
FIG. 3 shows an exploded view of a device for joining and separating printed circuit boards according to an alternative form of the present invention.

FIG. 3 shows an exploded view of a device 30a for joining and separating boards 12 and 14, according to an alternative form of the present invention. Device 30a includes a screw 28a and a spacer 24 with a threaded hole 26 therein. Screw 28a has a head 34, shaft 36 and threaded portion 38. Shaft 36 includes a groove 40. Device 30a also includes washers 42 and 44 and snap ring 46. When assembled, washers 42 and 44 are disposed on opposite sides of board 14. Snap ring 46 fits into groove 40 to hold screw 28a captive to board 14. Washer 42 is disposed between head 34 and board 14. Washer 44 is disposed between board 14 and snap ring 46. Washer 44 is preferably flexible and in an exemplary embodiment nylon.

According to a preferred form of the FIG. 2 and FIG. 3 embodiments, secondary board 14 is grounded to main board 12 by means of device 30/30a. In such embodiment, spacer 24 and screw 28/28a are electrically conductive. In the FIG. 3 embodiment, washer 42 will also be electrically conductive in order to ensure a good ground contact between board 14 and screw 28a. One advantage of having device 30/30a serve as a ground connection is that it frees up a pin in connector 16 for another signal.

Figure 4:
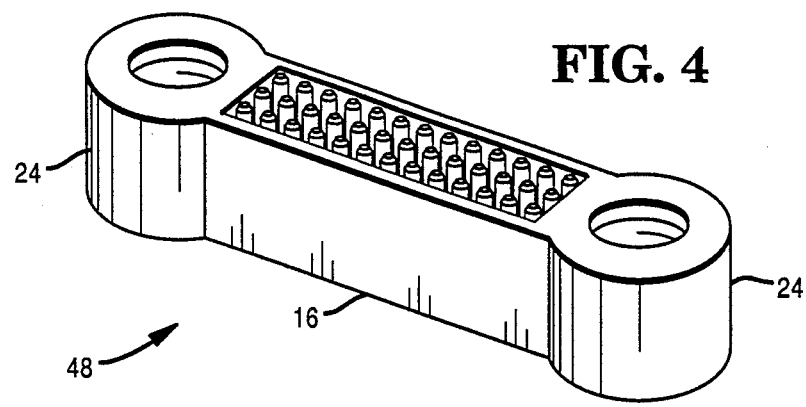
FIG. 4 is a perspective view of a connector/spacer sub-assembly according to another form of the present invention.

FIG. 4 shows yet another modification of the present invention. In this embodiment, a connector 16 and spacers 24, such as described previously, are integrally connected to form a combined connector/spacer 48.

Figure 5:
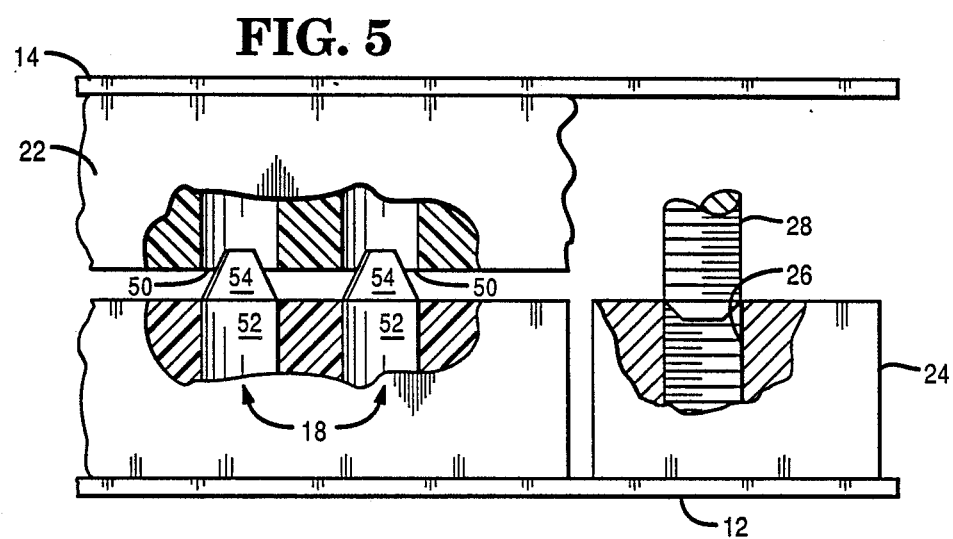
FIG. 5 is a side view of a portion of a printed circuit board assembly.

FIG. 5 shows a more detailed view showing the orientation of pins 18, socket 22 with holes 50, screw 28 and the threaded hole 26 of spacer 24. Each pin 18 has a shaft 52 and a tapered end 54. As main board 12 and secondary board 14 are brought together, the tapered ends 54 of pins 18 enter the holes 50 in socket 22. As the various tapered ends 54 find their respective mating holes 50 any lateral motion between boards 12 and 14 is basically eliminated, and screws 28 and spacers 24 are aligned. To further draw boards 12 and 14 together, screw 28 engages threaded hole 26 and as screw 28 is turned the shafts 52 of pins 18 enter holes 50. In this manner, boards 12 and 14 are joined.

In order to separate the boards, each screw 28/28a is simply backed off. Referring to the FIG. 2 embodiment, as screw 28 is backed off from spacer 24, washer 32, which rotates with screw 28, presses against board 14. This action separates boards 12 and 14 while gradually releasing pins 18 from socket 22. In the FIG. 3 embodiment, snap ring 46 presses against washer 44 and board 14 to separate the boards. If devices 30 are closely spaced on a board, disengaging one screw before loosening the others may result in binding or bending of pins 18. To avoid this, all screws 28/28a are partially backed off before any one screw 28/28a is completely disengaged. In this manner, pins 18 are evenly removed from sockets 22 without damage.

It will be clear to those skilled in the art that the present invention is not limited to the specific embodiments disclosed and illustrated herein. It will be understood that the dimensions and proportional and structural relationships shown in the drawings are illustrated by way of example only and these illustrations are generally not to be taken as the actual dimensions or proportional structural relationships used in the printed circuit board assembly of the present invention.

Numerous modifications, variations, and full and partial equivalents can be undertaken without departing from the invention as limited only by the spirit and scope of the appended claims.

What is desired to be secured by Letters Patent of the United States is as follows.

What is claimed is:

1. A device for joining and separating first and second printed circuit boards connectable by a socket on one of said boards and a plurality of pins projecting from the other of said boards, comprising:
   a screw held captive to said first board but rotatable therein;
   means for preventing longitudinal movement of said screw relative to said first board; and
   a spacer fastened to said second board and having a threaded hole for receiving said screw;
   wherein said pins are inserted into and withdrawn from said socket by the engagement and disengagement, respectively, of said threaded hole by said screw.

2. A device for joining and separating first and second generally parallel printed circuit boards connectable by a socket on one of said boards and a plurality of pins projecting normally from the other of said boards, comprising:
   a screw held captive to said first board but rotatable therein;
   means for preventing longitudinal movement of said screw relative to said first board; and
   a spacer fastened to said second board and having a threaded hole for receiving said screw;
   wherein said pins are inserted into and withdrawn from said socket by the engagement and disengagement, respectively, of said threaded hole by said screw.

3. A printed circuit board assembly comprising:
   a main board;
   a secondary board;
   a plurality of connector pins connected to and extending from one of said boards;
   a socket for receiving said pins connected to the other of said boards;
   a spacer fastened to one of said boards and having a threaded hole therein;
   a screw extending through the board without said spacer for engaging said threaded hole; and
   means for holding said screw captive to such board, said holding means including means for preventing longitudinal movement of said screw relative to such board and permitting rotation of said screw relative thereto;
   wherein said pins are inserted into and withdrawn from said socket by the engagement and disengagement, respectively, of said threaded hole by said screw.

4. A printed circuit board assembly comprising:
   a main board having a plurality of connector pins extending therefrom;
   a spacer fastened to said board and having a threaded hole therein;

a secondary board having a socket for receiving said pins;

a screw extending through said secondary board for engaging said threaded hole; and means for holding said screw captive to such board, said holding means including means for preventing longitudinal movement of said screw relative to such board and permitting rotation of said screw relative thereto;

wherein said pins are inserted into and withdrawn from said socket by the engagement and disengagement, respectively, of said threaded hole by said screw.

5. The printed circuit board assembly of claim 4 wherein said screw and spacer are electrically conductive and provide a ground connection between said secondary board and said main board.

6. The printed circuit board assembly of claim 4 wherein said secondary board includes a plurality of said screws, said holding means and sockets.

7. The printed circuit board assembly of claim 4 wherein said means for preventing longitudinal movement of said screw includes a flexible washer frictionally attached to said screw.

8. The printed circuit board assembly of claim 7 wherein said washer is nylon.

9. The printed circuit board assembly of claim 4 wherein said means for preventing longitudinal movement of said screw includes a snap ring disposed in a groove on the shaft of said screw.

10. The printed circuit board assembly of claim 9, further comprising first and second washers on said screw and disposed on opposite sides of said secondary board.

11. The printed circuit board assembly of claim 9 wherein said second washer is disposed between said secondary board and said snap ring.

12. The printed circuit board assembly of claim 11 wherein said first washer is electrically conductive and said second washer is nylon.

13. The printed circuit board assembly of claim 4 further comprising:

a connector attached to said main board;

wherein said connector includes said pins and a shroud which surrounds said pins.

14. The printed circuit board assembly of claim 13 wherein said connector is integral with said spacer.

15. The printed circuit board of claim 4 wherein said socket includes a plurality of pin holes for receiving said pins.

16. The printed circuit board assembly of claim 15 wherein each of said pins has a shaft and a tapered end.

17. The printed circuit board assembly of claim 16 wherein said pins, pin holes, screw and threaded hole are oriented such that as said main and secondary boards are brought together, firstly said tapered ends of said pins enter said pin holes, secondly said screw engages said threaded hole and thirdly said shaft enters said pin hole.

18. A printed circuit board assembly comprising:

a main board;

a connector attached to said main board and having a plurality of connector pins and a shroud surrounding said pins;

a plurality of spacers, each fastened to said board and having a threaded hole therein;

a secondary board having a socket with a plurality of pin holes for receiving said pins;

a plurality of screws, each extending through said secondary board for engaging a respective one of said threaded holes; and means for holding each of said screws captive to said secondary board, for preventing longitudinal movement of said screw relative to said secondary board and for permitting rotation of said screw relative to said secondary board;

wherein said pins are inserted into and withdrawn from said socket by the engagement and disengagement, respectively, of said threaded holes by respective ones of said screws.

19. The printed circuit board assembly of claim 18 wherein each of said pins has a shaft and a tapered end, and wherein said pins, pin holes, screws and threaded holes are oriented such that as said main and secondary boards are brought together, firstly said tapered ends of said pins enter said pin holes, secondly said screws engage said threaded holes and thirdly said shaft enters said pin hole.

20. The printed circuit board assembly of claim 19 wherein said screw and spacer are electrically conductive and provide a ground connection between said secondary board and said main board.

21. The printed circuit board assembly of claim 20 wherein said means for preventing longitudinal movement of said screw includes a nylon washer frictionally attached to said screw.

22. The printed circuit board assembly of claim 20 further comprising an electrically conductive washer and nylon washer on said screw and disposed on opposite sides of said secondary board, wherein said means for preventing longitudinal movement of said screw includes a snap ring disposed in a groove on the shaft of said screw, and wherein said nylon washer is disposed between said secondary board and said snap ring.

23. The printed circuit board assembly of claim 20 wherein said connector is integral with said spacer.

* * * * *

UNITED STATES PATENT AND TRADEMARK OFFICE
CERTIFICATE OF CORRECTION

PATENT NO. : 4,929,185

DATED : May 29, 1990

INVENTOR(S) : Daniel T. Wong, et al.

It is certified that error appears in the above-identified patent and that said Letters Patent is hereby corrected as shown below:

Title page, --[73] Assignee: NRC Corporation, Dayton, Ohio-- to -- [73] Assignee: NCR Corporation, Dayton, Ohio--

Signed and Sealed this

Thirteenth Day of August, 1991

*Attest:*

HARRY F. MANBECK, JR.

*Attesting Officer*  *Commissioner of Patents and Trademarks*